United States Patent [19]

Ishihara

[11] 4,355,420

[45] Oct. 19, 1982

[54] FREQUENCY CONVERTER CAPABLE OF ELIMINATING LOCAL POWER LEAK

[75] Inventor: Hiroyuki Ishihara, Tokyo, Japan

[73] Assignee: Nippon Electric Co., Ltd., Tokyo, Japan

[21] Appl. No.: 212,208

[22] Filed: Dec. 2, 1980

[30] Foreign Application Priority Data

Dec. 3, 1979 [JP] Japan .................................. 54-155522

[51] Int. Cl.$^3$ .......................... H04B 1/26; H04B 1/10
[52] U.S. Cl. ................................... 455/317; 455/319; 455/326; 455/330
[58] Field of Search .................... 455/302, 317–319, 455/323, 271, 325–328, 330; 329/174, 163; 332/43, 24

[56] References Cited

U.S. PATENT DOCUMENTS 3,515,993  6/1970  Merriam ............................. 455/326

FOREIGN PATENT DOCUMENTS 55-134507 10/1980 Japan .................................. 455/326

OTHER PUBLICATIONS

R. B. Mouw et al., "Broad–Band Double Balanced Mixer/Modulators" in the Microwave Journal, Mar. 1969.

Primary Examiner—Jin F. Ng
Attorney, Agent, or Firm—Laff, Whitesel, Conte & Saret

[57] ABSTRACT

A frequency converter has first, second and third terminals which receive a first signal having a first frequency band, a local oscillation signal, and a second signal having a second frequency band. The first signal and the local oscillation signal are mixed to generate the second signal. A first branching circuit is connected between the second terminal and the frequency mixer, for branching part of the local oscillation signal. A first part of the branched local oscillation signal, which is supplied from the first branching circuit, and a first leaked local oscillation signal are applied from the frequency mixer to the first terminal. The phase and amplitude of the first branched local oscillation signal are adjusted so that the first branched local oscillation signal and the first leaked local oscillation signal have equal amplitude and are reversed in phase to cancel each other.

13 Claims, 10 Drawing Figures

FREQUENCY CONVERTER CAPABLE OF ELIMINATING LOCAL POWER LEAK

The present invention relates to a frequency converter.

In a frequency converter, there may be a power leak from the local oscillator to signal terminals which results in spurious radiation into another channel or into its own signal band, thereby causing a deterioration of signal transmission characteristics. In frequency converters of the prior art, a band-pass filter, low-pass filter or isolator is usually provided in the signal input/output terminal section to prevent local power from leaking to the signal input/output terminals. However, any isolator or filter is limited in its leak preventing performance, and more particularly such performance of a band-pass filter deteriorates if the local frequency and signal frequency are close to each other.

If the local frequency and the signal frequency are close to each other, the use of a balanced mixer is also conceivable. For an example of a balanced mixer, reference is made to, R. B. Mouw et al., "Broad-band Double Balanced Mixer/Modulators" in The Microwave Journal, March 1969. In this balanced mixer, hybrid junctions are used for branching and coupling signals and these junctions are incapable of sufficiently preventing a power leak on account of inadequate isolation and the unbalance of local power reflections from a plurality of diodes provided for the mixing purpose.

One objective of the present invention, therefore, is to provide a frequency converter for the maximum practicable prevention of a local power leak.

In accordance with the present invention, a frequency converter has first, second and third terminals respectively supplied with a first signal having a first frequency band, a local oscillation signal, and a second signal having a second frequency band. A frequency mixer frequency-mixes the first signal and the local oscillation signal to generate the second signal. A first branching means is connected between the second terminal and the frequency mixer, for branching part of the local oscillation signal. A first coupling means is connected between the first terminal and the frequency mixer, for coupling a first branched local oscillation signal supplied from the first branching means and a first leaked local oscillation signal from the frequency mixer. A first amplitude-phase adjuster is connected between the first branching means and the first coupling means, for adjusting the phase and amplitude of the first branched local oscillation signal so that the first branched local oscillation signal and the first leaked local oscillation signal are equal in amplitude and reverse in phase to each other.

Features and advantages of the present invention will be more apparent from the detailed description hereunder taken in conjunction with the accompanying drawings, wherein.

Figure 1:
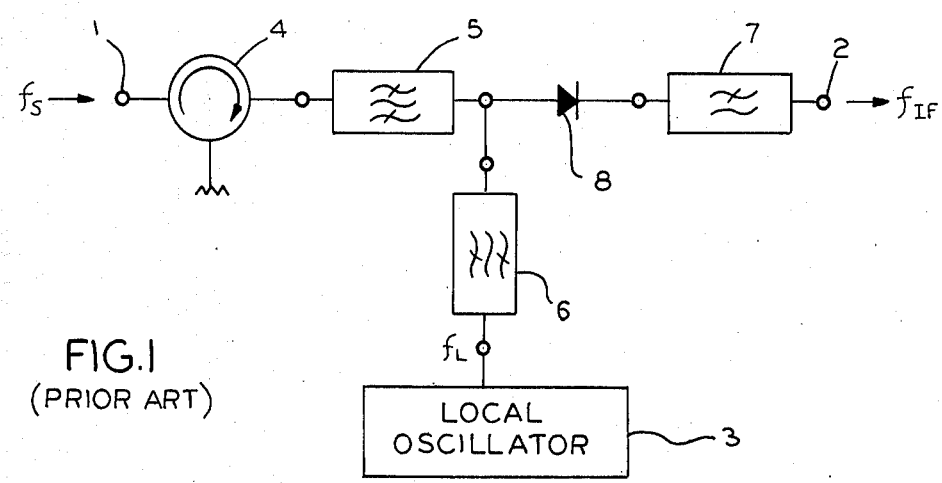
FIG. 1 is a block diagram illustrating a conventional frequency converter for the signal receiving purpose, in which an isolator and filters are used.
Figure 8A:
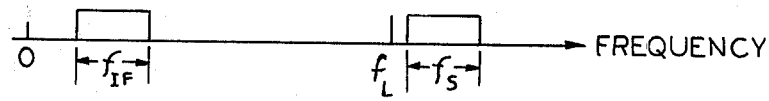
Figure 8B:
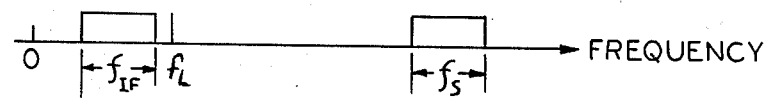

FIGS. 8A and 8B are a pair of diagrams showing signal arrangements to help describe the present invention; and Referring to FIG. 1, an RF signal having a frequency $f_S$ is supplied through an input terminal 1, an isolator 4 and a band-pass filter 5 to a mixer diode 8, together with a local signal (having a frequency $f_L$) supplied from a local oscillator 3 through a band-pass filter 6. In the mixer diode 8, the RF signal and local signal are frequency-mixed to provide an intermediate frequency (IF) signal having a frequency $f_{IF}$, which is supplied to an IF output terminal 2 via a low-pass filter 7.

In the frequency converter of FIG. 1, the local power leak to the RF signal input terminal 1 is prevented by the isolator 4 and band-pass filter 5. A leak to the IF signal output terminal 2 is prevented by the low-pass filter 7. While the isolator 4 absorbs any power leak, usually by around 25 dB, an isolator-dependent absorption has its own limit because the use of a plurality of isolators would result in an increased transmission loss.

Figure 2:
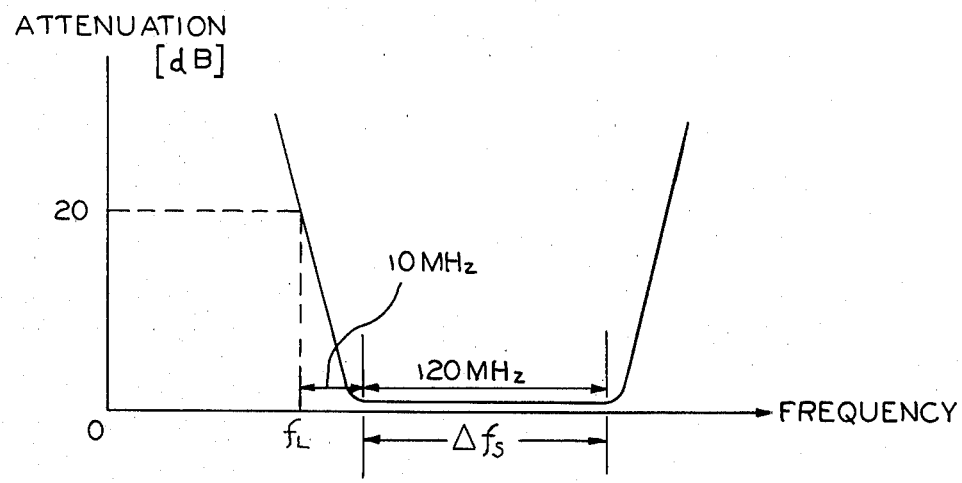
FIG. 2 is a diagram showing a typical arrangement of the frequencies of a radio frequency (RF) signal and a local signal, together with an exemplary pass characteristic of a bandpass filter.

To the band-pass filter 5 can be assigned a sufficient attenuation to block a local power leak if the local oscillator frequency $f_L$ is substantially far from the signal frequency $f_S$, but not if these two frequencies are close to each other. For instance, as shown in FIG. 2, if the signal band width $\Delta f_S$ is 120 MHz and the local oscillator frequency $f_L$ is 10 MHz distant from one end of the signal band, an obtaining of an attenuation of 40 dB or more with a 0.1-dB ripple Chebyshev type band-pass filter would require at least 14 stages. The resultant transmission loss and deterioration of group delay frequency characteristics would be too great for the frequency converter to serve any practical purpose.

Figure 3:
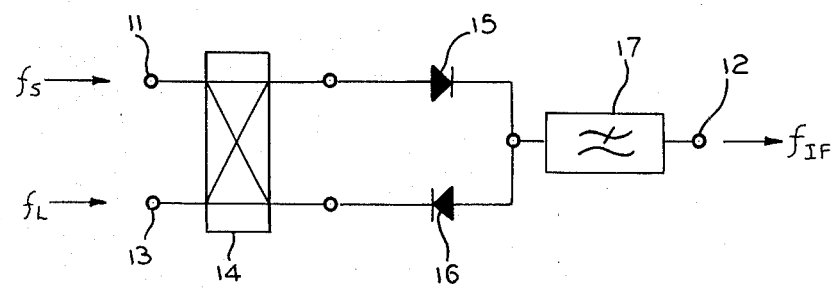
FIG. 3 is a block diagram illustrating a balanced type frequency converter of the prior art.

Since a local power leak and the signal are acting in the same electrical direction at the IF output terminal 2, an isolator cannot be arranged in a serial relationship relative to the low-pass filter 7. Therefore, the local power leak to the IF output terminal 2 can be rejected only by the low-pass filter.

Where the signal frequency $f_S$ and local oscillator frequency $f_L$ are very close to each other, either a balanced mixer as shown in FIG. 3 or a double-balanced mixer is usually employed. In FIG. 3, a local oscillation signal which is supplied to a terminal 13, from a local oscillator (not shown), is branched by a 180° hybrid junction 14. These branched signals have 180° phase differences with respect to each other, and the branched signals are supplied to mixer diodes 15 and 16, respectively. Meanwhile, an RF signal supplied to a terminal 11 is also branched by the 180° hybrid junction 14. The resultant branched signals are similarly supplied to the mixer diodes 15 and 16, respectively. These local and RF signals are respectively mixed in the mixer diodes 15 and 16, and turned into an IF signal which is provided to an IF output terminal 12 via a low-pass filter 17.

In the frequency converter of FIG. 3, if the local oscillation frequency as seen at terminal 13 is made, as shown in FIG. 2, close to the signal frequency band observed at terminal 11 and made far from an intermediate frequency as viewed at terminal 12, the local power reflected at the diodes 15 and 16 returns to the RF input terminal 11, but it hardly leaks to the IF output terminal 12. The reflection of local power to the RF terminal 11 can be prevented irrespective of the RF frequency $f_s$, due to the 180° hybrid junction 14. This is in contrast with the prior art configuration shown in FIG. 1. However, on account of the limited isolation capability of the hybrid junction 14 and the unbalance between local power reflections from the diodes 15 and 16, the elimination of the local leak is usually only around 30 dB in the frequency converter of FIG. 3.

As stated above, in a frequency converter of the prior art, it is impossible to prevent local power leakage to the RF input terminal 1 or 11, beyond a certain extent. Moreover, if the local oscillator frequency $f_L$ and intermediate frequency $f_{IF}$ are close to each other, it is impossible to achieve an adequate elimination of local power leakage with the low-pass filter 7 or 17 alone.

Figure 4:
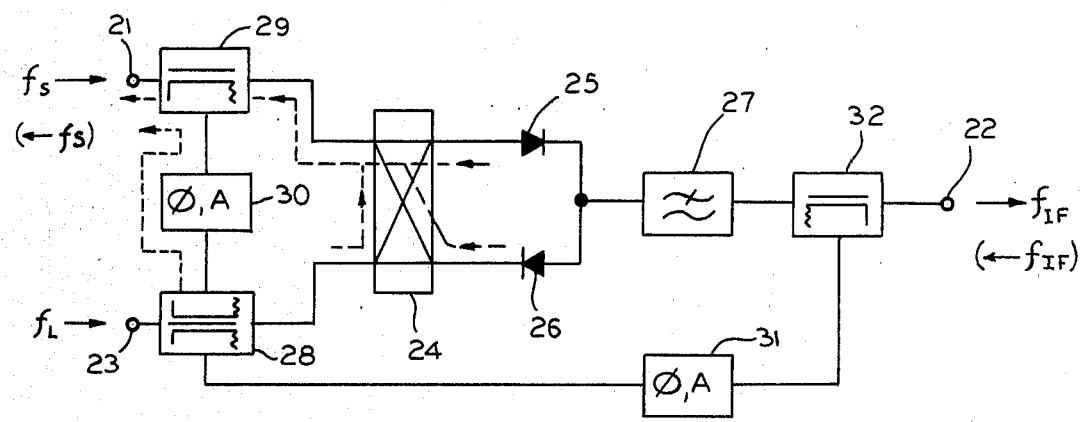
FIG. 4 is a block diagram illustrating a preferred embodiment of a balanced type frequency converter in accordance with the present invention.

In a preferred embodiment of the present invention illustrated in FIG. 4, the frequency conversion is achieved in the same manner as in the conventional device shown in FIG. 3. Thus an RF signal supplied to a terminal 21 and a local oscillation signal supplied to another terminal 23 are entered into a hybrid junction 24, respectively through a coupling circuit 29 and a branching circuit 28, branched thereat and supplied to mixer diodes 25 and 26. An IF signal obtained from the mixer diodes 25 and 26 is supplied to a terminal 22 via a low-pass filter 27 and a coupling circuit 32.

Part of the local signal leaks out to the side of the signal input terminal 21, as indicated by a dashed line, owing to inadequate isolation by the hybrid junction 24 and to an unbalance between the mixer diodes 25 and 26. If the local oscillator frequency and IF frequency are close to each other, part of the local signal also leaks to the IF output terminal 22. The part of the local signal leaking to the signal terminal 21 side usually is a signal attenuated by about 30 dB. This local oscillation signal leakage to the signal terminal 21 side is combined at the coupling circuit 29 with another local signal which is branched by the branching circuit 28 and adjusted in amplitude and phase by an amplitude-phase adjusting circuit 30. If, in this procedure, the amplitude-phase adjusting circuit 30 is regulated to give the two local signals equal amplitudes and reverse phases with respect to each other, local power leakage to the signal input terminal 21 side can be reduced to essentially zero.

Similarly, local signal leakage to the IF output terminal 22 side can be eliminated by combining it at the coupling circuit 32 with another local signal which is adjusted in amplitude and phase by an amplitude-phase adjusting circuit 31. Although the coupling circuit 32 can be alternatively inserted before the low-pass filter 27, it is better arranged if placed after the filter 27, as illustrated, to facilitate an impedance matching between the mixer diodes 25 and 26 and the filter 27. As can be seen from the foregoing explanation, local power leakage to the IF output terminal 22 side can be almost fully blocked by the low-pass filter 27 if the local oscillator frequency and IF frequency are sufficiently distant from each other. Therefore, the amplitude-phase adjusting circuit 31 and coupling circuit 32 can be dispensed with in this case.

The branching circuit 28 can include, for instance, a directional coupler having 10 dB coupling. The coupling circuits 29 and 32 can include directional couplers having approximately a 10 dB coupling, for coupling the outputs of the amplitude-phase adjusting circuits 30 and 31 with leaked local signals and passing desired signals without any disturbances.

Figure 5:
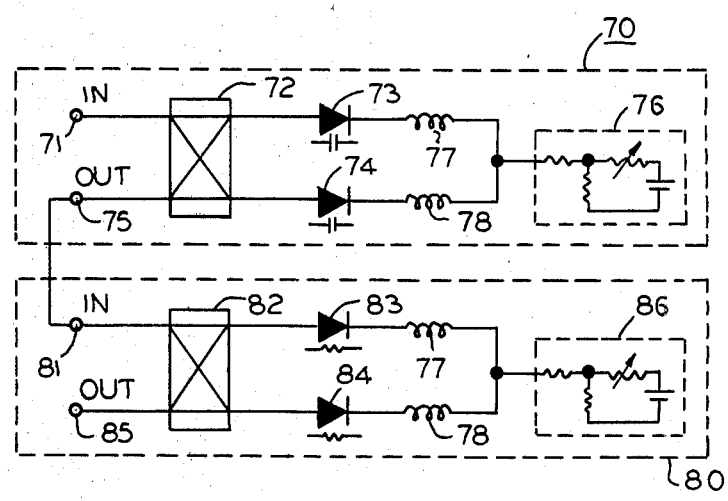
FIG. 5 is a diagram outlining an example of an amplitude-phase adjusting circuit in accordance with the present invention.

The amplitude-phase adjusting circuits 30 and 31 can be realized with circuits as shown in FIG. 5. A branched local signal from the branching circuit 28 (FIG. 4) is supplied through an input terminal 71 (FIG. 5) of a phase-adjusting circuit 70 to a 90° hybrid junction 72, from which it is further impressed on varactor diodes 73 and 74. After the phase of the local signal is adjusted as desired by controlling the capacitances of the varactor diodes 73 and 74, the resulting adjusted local signal is led to an output terminal 75 by the hybrid junction 72. Capacitance control over the varactor diodes 73 and 74 is achieved by regulating the bias voltage of a D.C. bias circuit 76.

The phase-adjusted local signal is supplied to an amplitude adjusting circuit 80, which, is structured similarly to the phase adjusting circuit 70. The PIN diodes 83 and 84 provide for amplitude adjustment and are inserted in positions corresponding to the varactor diodes 73 and 74. Resistance control over the PIN diodes 83 and 84 as attenuators is achieved by means of a D.C. bias circuit 86. Reference numerals 77 and 78, identify choke coils for blocking high frequency signals.

Figure 6:
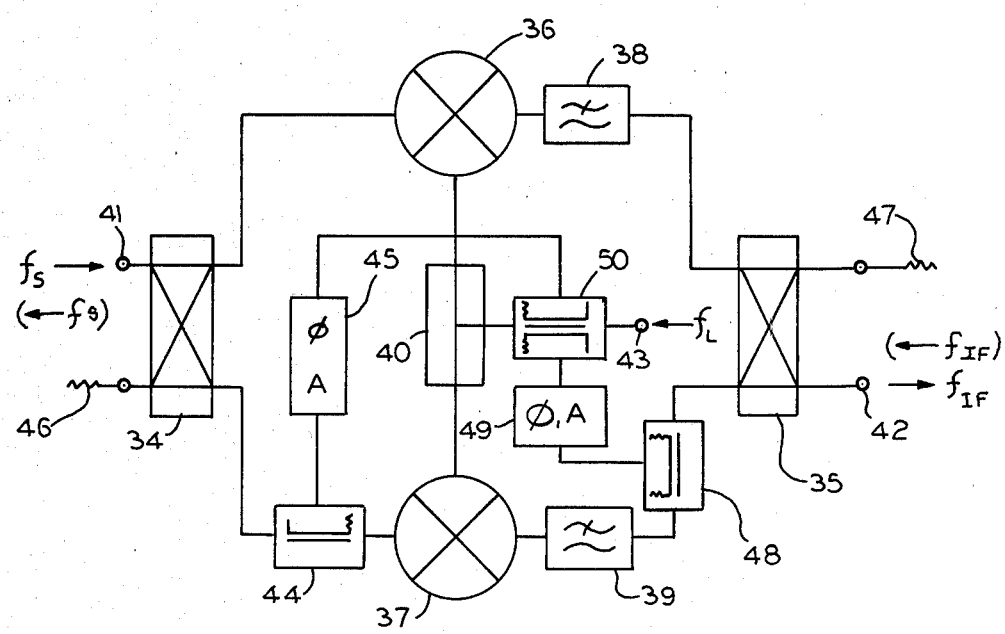
FIG. 6 is a block diagram of a preferred embodiment of a double-balanced type frequency converter in accordance with the present invention.

The double-balanced frequency converter illustrated in FIG. 6, is another preferred embodiment of the present invention. A local signal supplied to a terminal 43 goes through a branching circuit 50 and is branched by a common-mode branching circuit 40. The resulting branched signals are applied to double-balanced mixers 36 and 37, respectively. An RF signal, on the other hand, is supplied to a terminal 41, and branched by a 90° hybrid junction 34 into signals having a 90° phase difference with respect to each other. One of the thus branched RF signals is directly applied to the mixer 36, while the other, lagging 90° behind it, is applied to the mixer 37 by way of a coupling circuit 44. The IF signals produced by the mixers 36 and 37 are respectively selected by low-pass filters 38 and 39, which are coupled to a common mode component by a 90° hybrid junction 35, and there are supplied to an IF output terminal 42. Reference numerals 46 and 47 identify terminating loads. The terminating load 47, in particular, is intended to absorb responses to signals in the image frequency band.

Parts of the local power impressed on the balanced mixers 36 and 37 leak out to the signal input terminal 41 side. If the local oscillator frequency and IF frequency are close to each other, the local oscillation power also partially leaks to the IF output terminal 42 side. The local power leak from the mixer 37 to the terminal 41 side is coupled by the coupling circuit 44 with one of the branched local oscillation signals from the branching circit 50. The signal from circuit 50 undergoes an amplitude and phase adjustment in an amplitude-phase adjusting circuit 45, which keeps the branched local signal and the leaked local signal from the mixer 36 equal in amplitude and 90° different in phase with respect to each other. With an adjustment achieved in this manner, the local signal leaking from the mixer 36 to the input terminal 41 side of the hybrid junction 34 and the local signal from the mixer 37 will be in reverse phase and equal in amplitude, and therefore cancel each other.

The result is that local power leakage only emerges at the terminating load 46, where it is wholly eliminated. Similarly, local power leaks from the mixers 36 and 37 to the IF output terminal 42 side are eliminated by adding them, at a coupling circuit 48, to local oscillation power which is branched from the branching circuit 50 and adjusted in phase and amplitude by an amplitude-phase adjusting circuit 49.

The circuits illustrated in FIG. 5 can be used as amplitude-phase adjusting circuits 45 and 49. The amplitude-phase adjusting circuit 49 and coupling circuit 48 are not always required, if the local oscillator frequency and IF frequency are sufficiently distant from each other. Then, local signal leaks to the IF output terminal 42 side can be vertually eliminated only by the low-pass filters 38 and 39. The coupling circuits 44 and 48 can as well be respectively inserted between the mixer 36 and hybrid junction 34 or between the hybrid junction 34 and terminal 41, and between the low-pass filter 38 and hybrid junction 35 or between the hybrid junction 35 and the terminal 42. This is because the phases and amplitudes of the branched local signals from the branching circuit 50 can be adjusted by the amplitude-phase adjusting circuits 45 and 49 to reduce the local signal leaks to the signal input terminal 41 and IF output terminal 42 to zero.

Figure 9:
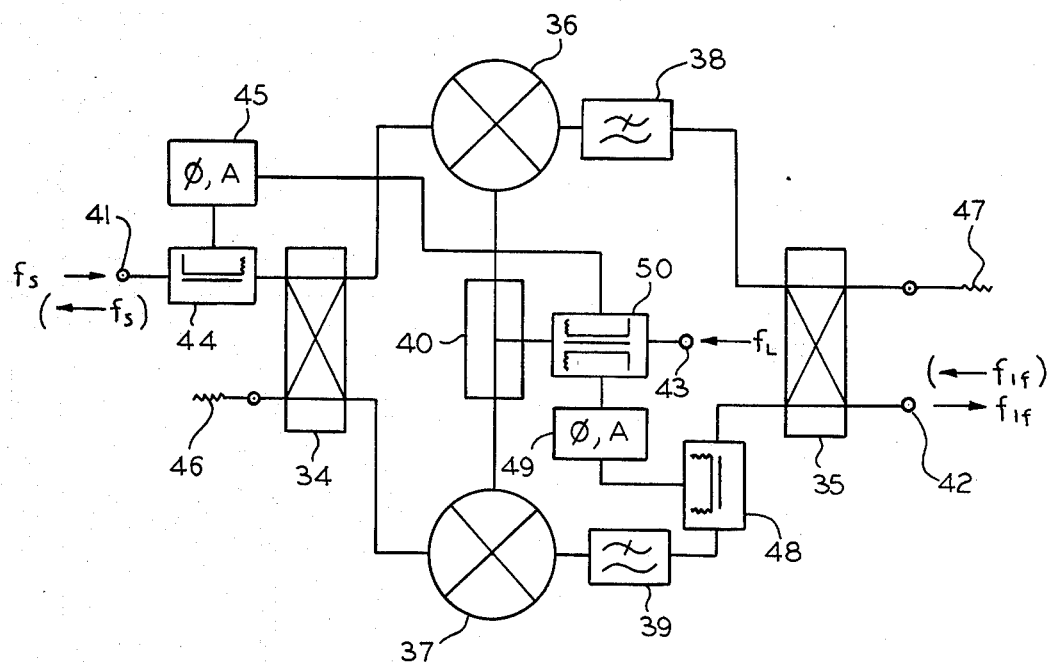

FIG. 9 shows one of the foregoing modifications in which the coupling circuit 44 is inserted between the hybrid junction 34 and terminal 41.

Figure 7:
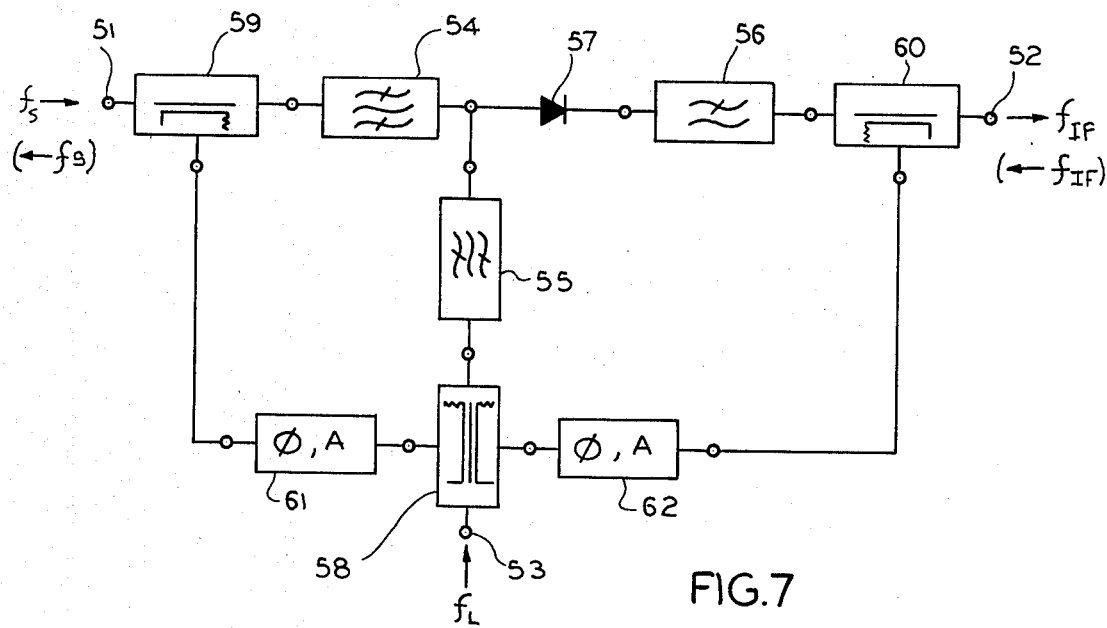
FIG. 7 is a block diagram of a preferred embodiment of a single frequency converter in accordance with the present invention.

The single frequency converter illustrated in FIG. 7 operates basically in the same manner as the frequency converter of FIG. 1. A mixer diode 57 mixes a signal fed to a terminal 51 with a local signal entered from a terminal 53 through a band-pass filter 55. An IF signal output is thus obtained and is supplied to a terminal 52. The local signal partly leaks from a band-pass filter 54 and low-pass filter 56 to the sides of the signal input terminal 51 and IF signal output terminal 52, respectively.

The local signal fed to the terminal 53 is partly branched at a branching circuit 58, into two directions. One of these local branched signals is supplied to a coupling circuit 59 by way of an amplitude-phase adjusting circuit 61, where it is adjusted to have an equal amplitude and a reverse phase with respect to a local signal leaking through the band-pass filter 54. The other local branched signal is adjusted by an amplitude-phase adjusting circuit 62 to have a reverse phase and an equal amplitude with respect to a local signal leaking through the low-pass filter 56, and supplied to a coupling circuit 60. The local signal leaks are thus cancelled by the branched local signals from the amplitude-phase adjusting circuits 61 and 62 in the coupling circuits 59 and 60, respectively.

If the local oscillator frequency and signal frequency are sufficiently distant from each other, the amplitude-phase adjusting circuit 61 and coupling circuit 59 are not always required. If the local oscillator frequency and IF frequency are far enough from each other, the amplitude-phase adjusting circuit 62 and coupling circuit 60 are dispensable. The coupling circuits 59 and 60 can as well be inserted after the band-pass filter 54 and before the low-pass filter 56, respectively.

As can be seen from the foregoing description, the frequency converter, in accordance with the present invention, is especially useful for a system wherein the local oscillator frequency $f_L$ and signal frequency $f_S$ are very close to each other as shown in FIG. 8A or the local frequency $f_L$ and IF frequency $f_{IF}$ are very close to each other as shown in FIG. 8B. Further, it is most suitable for a system required to minimize local power leaks to signal input/output terminals. The frequency converter in accordance with the present invention also has an advantage of being able, because of the very principle on which it is based, to reduce group delay distortions on signals to zero and to keep transmission losses small.

Although the foregoing embodiments only concern frequency converters for signal reception, it may be obvious that the invention can as well be applied to frequency converters for signal transmission. In this case, the IF output terminals shown in FIGS. 4, 6 and 7 have to be replaced with signal (IF signal) input terminals, and the signal input terminals therein with RF signal output terminals. That is, an IF input signal is supplied to IF terminal 22 (FIG. 4), 42 (FIG. 6), or 52 (FIG. 7), and an RF output signal is provided at RF terminal 21 (FIG. 4), 41 (FIG. 6) or 51 (FIG. 7).

What is claimed is:

1. A frequency converter comprising first, second and third terminals respectively supplied with a first signal having a first frequency band, a local oscillation signal, and a second signal having a second frequency band; frequency mixing means for frequency-mixing said first signal and said local oscillation signal to generate said second signal; branching means coupled between said second terminal and said frequency mixing means, for branching part of said local oscillation signal to provide a branched local oscillation signal; coupling means, connected between said first terminal and said frequency mixing means, for supplying said branched local oscillation signal to said first terminal; and amplitude-phase adjusting means, connected between said branching means and said coupling means, for adjusting the phase and amplitude of said branched local oscillation signal so that said branched local oscillation signal and a leakage local oscillation signal which leaks from said frequency mixing means are equal in amplitude and reverse in phase with respect to each other at said first terminal.

2. A frequency converter, as claimed in claim 1, wherein said frequency mixing means comprises common-mode branching means, connected to said branching means, for branching said local oscillation signal into two signals in a common mode; first and second balanced mixer means respectively supplied with said two signals branched from said common-mode branching means, said first balanced mixer means being connected to said coupling means; first and second filter means, respectively connected to said first and second balanced mixer means, for passing said second signal; first 90° hybrid junction means having first through fourth arms, said first through fourth arms being connected to said first and second filter means, said third terminal and first terminating load means, respectively; and second 90° hybrid junction means having fifth through eighth arms, said fifth through eighth arms being connected to said first terminal, said coupling means, said second balanced mixer means and second terminating load means, respectively.

3. A frequency converter, as claimed in claim 1, wherein said frequency mixing means comprises common-mode branching means, connected to said branching means, for branching said local oscillation signal into two signals in a common mode; first and second balanced mixer means respectively supplied with said two signals branched from said common-mode branching means; first and second filter means, respectively connected to said first and second balanced mixer means, for passing said second signal; first 90° hybrid junction means having first through fourth arms, said first through fourth arms being connected to said first and second filter means, said third terminal and first terminating load means, respectively; and second 90° hybrid junction means having fifth through eighth amrs, said fifth through eighth arms being connected to said coupling means, said first and second balanced mixer means and second terminating load means, respectively.

4. A frequency converter, as claimed in claim 1, wherein said frequency mixing means comprises 180° hybrid junction means having first through fourth arms, said first and second arms being respectively connected to said branching means and coupling means; first and second mixer diodes connected to said third and fourth arms; and first filter means connected between said third terminal and both of said first and second mixer diodes, for passing said second signal.

5. A frequency converter comprising first, second and third terminals respectively supplied with a first signal having a first frequency band, a local oscillation signal and a second signal having a second frequency band; frequency mixing means for frequency-mixing said second signal and said local oscillation signal to generate said first signal; branching means, connected between said second terminal and said frequency mixing means, for branching part of said local oscillation signal to provide a branched local oscillation signal; coupling means, connected between said first terminal and said frequency mixing means, for supplying said branched local oscillation signal to said first terminal; and amplitude-phase adjusting means, connected between said branching means and said coupling means, for adjusting the phase and amplitude of said branched local oscillation signal so that said branched local oscillation signal and a leakage local oscillation signal which leaks from said frequency mixing means are equal in amplitude and reverse in phase with respect to each other at said first terminal.

6. A frequency converter, as claimed in claim 1 or 5, wherein said frequency mixing means comprises first filter means connected to said coupling means for passing said first signal; second filter means connected to said branching means for passing said local oscillation signal; third filter means connected to said third terminal for passing said second signal; and a mixer diode connected between said third filter means and both of said first and second filter means.

7. A frequency converter, as claimed in claim 1 or 5, wherein said frequency mixing means comprises a mixer diode; first filter means connected between said first terminal and said mixer diode in a serial relationship with said coupling means, for passing said first signal; second filter means connected between said branching means and said mixer diode, for passing said local oscillation signal; and third filter means connected between said third terminal and said mixer diode, for passing said second signal.

8. A frequency converter comprising first, second and third terminals respectively supplied with a first signal having a first frequency band, a local oscillation signal and a second signal having a second frequency band; branching means coupled to said second terminal, for branching said local oscillation signal into first, second and third branched signal; frequency mixing means for frequency-mixing said third branched signal and said first signal to generate said second signal; first coupling means connected between said first terminal and said frequency mixing means, for supplying said first branched signal to said first terminal; first amplitude-phase adjusting means connected between said branching means and said first coupling means, for adjusting the phase and amplitude of said first branched signal so that said first branched signal and a first leakage local oscillation signal leaked from said frequency mixing means are equal in amplitude and reverse in phase with respect to each other at said first terminal; second coupling means connected between said third terminal and said frequency mixing means, for supplying said second branched signal to said third terminal; and second amplitude-phase adjusting means connected between said branching means and said second coupling means, for adjusting the phase and amplitude of said second branched signal so that said second branched signal and a second leakage local oscillation which signal leaks from said frequency mixing means are equal in amplitude and reverse in phase with respect to each other at said third terminal.

9. A frequency converter, as claimed in claim 8, wherein said frequency mixing means comprises a mixer diode; first filter means connected between said first terminal and said mixer diode in a serial relationship with said coupling means, for passing said first signal; second filter means connected between said branching means and said mixer diode, for passing said local oscillation signal; and third filter means connected between said third terminal and said mixer diode in a serial relationship with said second coupling means, for passing said second signal.

10. A frequency converter, as claimed in claim 8, wherein said frequency mixing means comprises 180° hybrid junction means having first through fourth arms, said first and second arms being respectively connected to said branching means and first coupling means, and first and second mixer diodes respectively connected to said third and fourth arms; and first filter means connected between said third terminal and both of said first and second mixer diodes in a serial relationship with said second coupling means, for passing said second signal.

11. A frequency converter, as claimed in claim 8, wherein said frequency mixing means comprises common-mode branching means, connected to said branching means, for branching said third branched signal into two signals in a common mode; first and second balanced mixer means respectively supplied with said two signals branched from said common-mode branching means, said first balanced mixer means being connected to said first coupling means; first and second filter means respectively connected to said first and second balanced mixer means for passing said second signal, said first filter means being connected to said second coupling means in series; first 90° hybrid junction means having first through fourth arms, said first through fourth arms being connected to said third terminal, said second filter means, said second coupling means and first terminating load means, respectively; and second 90° hybrid junction means having fifth through eighth arms, said fifth through eighth arms being connected to said first coupling means, said first terminal, said second balanced mixer means and second terminating load means, respectively.

12. A frequency converter, as claimed in claim 8, wherein said frequency mixing means comprises common-mode branching means, connected to said branching means, for branching said third branched signal into two signals in a common mode; first and second balanced mixer means respectively supplied with said two signals branched from said common-mode branching means; first and second filter means respectively connected to said first and second balanced mixer means for passing said second signal, said first filter means being connected to said second coupling means in series; first 90° hybrid junction means having first through fourth arms, said first through fourth arms being connected to said second filter means, said third terminal, said second coupling means and first terminating load means, respectively; and second 90° hybrid junction means having fifth through eighth arms, said fifth through eighth arms being connected to said first and second balanced mixer means, said first coupling means and second terminating load means, respectively.

13. A frequency converter, as claimed in claim 8, wherein said frequency mixing means comprises first filter means connected to said first coupling means for passing said first signal; second filter means connected to said branching means for passing said local oscillation signal; third filter means connected to said second coupling means for passing said second signal; and a mixer diode connected between said third filter means and both of said first and second filter means.

* * * * *

UNITED STATES PATENT AND TRADEMARK OFFICE
CERTIFICATE OF CORRECTION

PATENT NO.  : 4,355,420
DATED       : OCTOBER 19, 1982
INVENTOR(S) : ISHIHARA, Hiroyuki It is certified that error appears in the above—identified patent and that said Letters Patent is hereby corrected as shown below:

Col. 2, Line 17, insert --Fig. 9 shows the modification of the double-balanced type frequency converter shown in Fig. 6--.

Col. 2, Line 68, insert a comma --,-- after "12".

Signed and Sealed this

Eleventh Day of January 1983

[SEAL]

Attest:

GERALD J MOSSINGHOFF

Attesting Officer — Commissioner of Patents and Trademarks